United States Patent
Kanno et al.

(10) Patent No.: US 12,282,253 B2
(45) Date of Patent: Apr. 22, 2025

(54) PHOTOSENSITIVE RESIN COMPOSITION

(71) Applicant: JSR CORPORATION, Tokyo (JP)

(72) Inventors: Kimiyuki Kanno, Tokyo (JP); Ryouta Tsuyuki, Tokyo (JP); Ryoji Tatara, Tokyo (JP)

(73) Assignee: JSR CORPORATION, Tokyo (JP)

( * ) Notice: Subject to any disclaimer, the term of this patent is extended or adjusted under 35 U.S.C. 154(b) by 651 days.

(21) Appl. No.: 17/506,786

(22) Filed: Oct. 21, 2021

(65) Prior Publication Data

US 2022/0043346 A1 Feb. 10, 2022

Related U.S. Application Data

(63) Continuation of application No. PCT/JP2020/007962, filed on Feb. 27, 2020.

(30) Foreign Application Priority Data

Apr. 25, 2019 (JP) .................................. 2019-083898

(51) Int. Cl.
G03F 7/038 (2006.01)
G03F 7/004 (2006.01)
G03F 7/20 (2006.01)
G03F 7/32 (2006.01)

(52) U.S. Cl.
CPC ............ *G03F 7/038* (2013.01); *G03F 7/0045* (2013.01); *G03F 7/20* (2013.01); *G03F 7/325* (2013.01)

(58) Field of Classification Search
CPC ...................................................... C07C 25/22
See application file for complete search history.

(56) References Cited

U.S. PATENT DOCUMENTS

2016/0202607 A1* 7/2016 Abe .................. G03F 7/0046
430/280.1
2021/0286262 A1* 9/2021 Yamaguchi ............ G03F 7/028

FOREIGN PATENT DOCUMENTS

| JP | H06-180501 A | 6/1994 |
| JP | 2006178059 A | 7/2006 |
| JP | 2012226297 A | 11/2012 |
| JP | 2014063148 A | 4/2014 |
| JP | 2014186300 A | 10/2014 |
| JP | 2016145913 A * | 8/2016 |
| JP | 2017015890 A | 1/2017 |
| JP | 2017197863 A | 11/2017 |
| JP | 2017198977 A | 11/2017 |
| JP | 2018197863 A | 12/2018 |
| JP | 2018198977 A | 12/2018 |
| WO | WO-2014034541 A1 * | 3/2014 ......... C08G 63/6826 |
| WO | WO-2020021827 A1 | 1/2020 |

OTHER PUBLICATIONS

English Machine Translation of WO2014034541A1 (Year: 2014).*
English Machine Translation of JP2016145913A (Year: 2016).*
Office Action issued Jul. 11, 2023 in Japanese Patent Application No. 2021-515839 (with English translation), 3 pages.
Office Action issued Feb. 28, 2023 in Japanese Patent Application No. 2021-515839 (with English translation), 4 pages.
International Search Report issued Apr. 21, 2020 in PCT/JP2020/007962, (with English translation) 5 pages.
Written Opinion issued Apr. 21, 2020 in PCT/JP2020/007962, (with English translation), 6 pages.
Office Action issued Mar. 16, 2023 in Taiwanese Patent Application No. 109106777 (with English translation), 11 pages.
Office Action issued Apr. 1, 2024 in corresponding Korean Patent Application No. 10-2021-7033890 (with English translation), 10 pages.

* cited by examiner

*Primary Examiner* — Mark F. Huff
*Assistant Examiner* — Nicholas E Brown
(74) *Attorney, Agent, or Firm* — Element IP, PLC

(57) ABSTRACT

An object of the present invention is to provide a photosensitive resin composition that can form an insulating film having low dielectric constant and low dielectric loss tangent and undergoing small changes in elongation properties in response to changes in environmental temperature. The photosensitive resin composition of the present invention contains: a polymer (A) having a structural unit (a1) represented by Formula (a1); a crosslinking agent (B); a photocation generator (C); and a compound (D) represented by Formula (D).

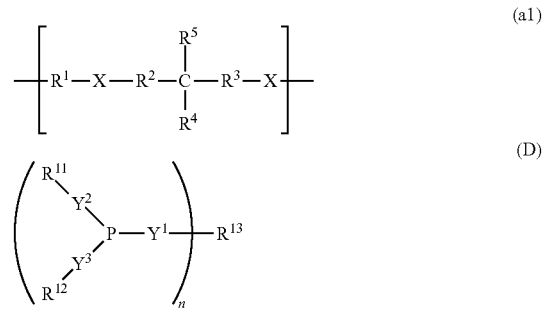

8 Claims, 1 Drawing Sheet

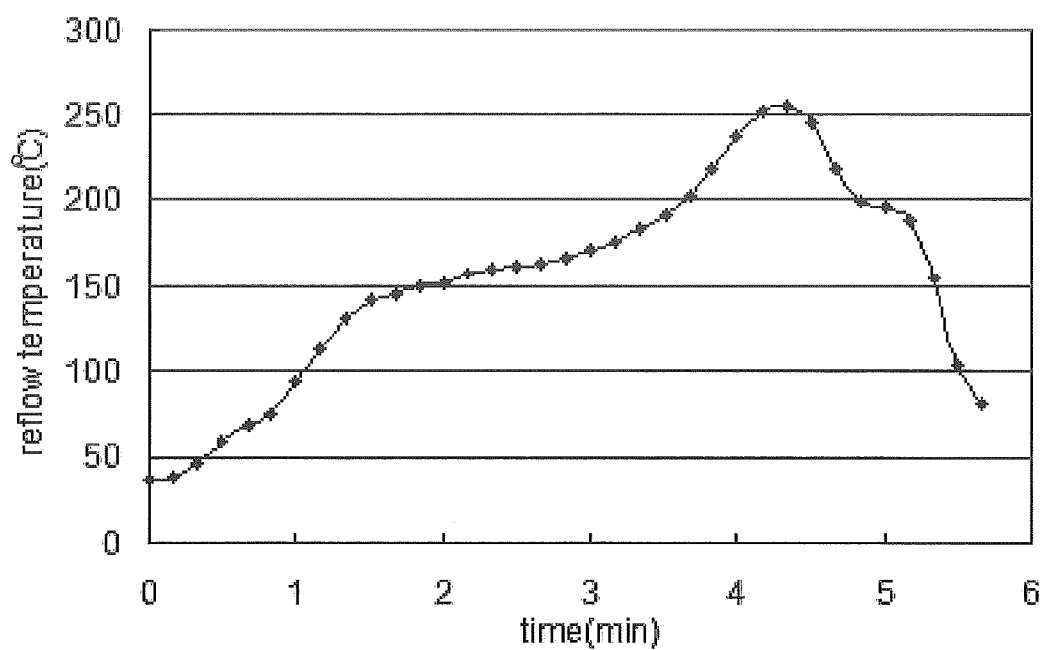

PHOTOSENSITIVE RESIN COMPOSITION

TECHNICAL FIELD

The present invention relates to a photosensitive resin composition.

BACKGROUND ART

In high-speed mobile communication devices, high-frequency electric signals are used to enhance processing speed. In a semiconductor circuit substrate used in high-speed mobile communication devices, a high-frequency electric signal drastically changes electric field. For this reason, an insulating film of the semiconductor circuit substrate has dielectric loss, accompanied by signal delay and heat generation of the insulating film, for which measures have been taken.

As a measure for heat generation of an insulating film, for example, a thin silicon interposer is used on a semiconductor circuit substrate to dissipate heat. However, the silicon interposer and the insulating film are different in thermal linear expansion coefficient. Unfortunately, when the insulating film has small elongation properties, heat may cause warpage or breakage in the thin silicon interposer or peeling of the insulating film (see Patent Literature 1 to 3).

CITATION LIST

Patent Literature

Patent Literature 1: JP 2017-015890 A
Patent Literature 2: JP 2017-197863 A
Patent Literature 3: JP 2018-198977 A

SUMMARY OF INVENTION

Technical Problem

In particular, an insulating film of a semiconductor circuit substrate used in high-speed mobile communication devices need to undergo small changes in elongation properties even in an environment where the temperature changes from low temperature to high temperature.

An object of the present invention is to provide a photosensitive resin composition that can form an insulating film having low dielectric constant and low dielectric loss tangent and undergoing small changes in elongation properties in response to changes in environmental temperature; a resin film having a pattern (hereinafter also referred to as a "patterned resin film"), the resin film having low dielectric constant and low dielectric loss tangent and undergoing small changes in elongation properties in response to changes in environmental temperature, and a method for producing the patterned resin film; and a semiconductor circuit substrate including the patterned resin film.

Solution to Problem

The present inventors have made intensive investigations to solve the problems described above. As a result, the present inventors have found out that the photosensitive resin composition having the following composition can solve the problems described above, and completed the present invention. The present invention is, for example, the following [1] to [7].

[1] A photosensitive resin composition containing: a polymer (A) having a structural unit (a1) represented by Formula (a1); a crosslinking agent (B); a photocation generator (C); and a compound (D) represented by Formula (D),

[chem. 1]

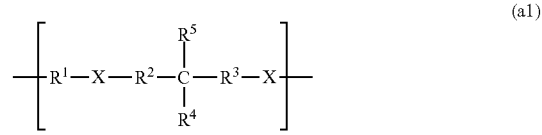

(a1)

wherein in Formula (a1), $R^1$ is an unsubstituted or substituted nitrogen-containing heteroaromatic ring or an unsubstituted or substituted aromatic hydrocarbon ring; $R^2$ and $R^3$ are each independently an unsubstituted or substituted aromatic hydrocarbon ring; $R^4$ is an unsubstituted or substituted alkyl group having 1 to 20 carbon atoms; $R^5$ is a hydrogen atom, or an unsubstituted or substituted alkyl group having 1 to 20 carbon atoms; and X's are each independently an oxygen atom, a sulfur atom, an ester bond, an amide bond, or $-SO_2-$,

[chem. 2]

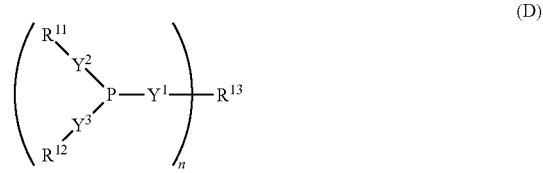

(D)

wherein in Formula (D), $Y^1$ to $Y^3$ are each independently a single bond or an oxygen atom; $R^{11}$ and $R^{12}$ are each independently a hydrogen atom, an alkyl group, or a monovalent group represented by Formula (d1); and n is an integer of 1 to 10, when n is 1, $R^{13}$ is a hydrogen atom, an alkyl group, or a monovalent group represented by Formula (d1), and at least one of $R^{11}$ to $R^{13}$ is a monovalent group represented by Formula (d1), when n is an integer of 2 to 10, $R^{13}$ is an n-valent organic group having at least one benzene ring optionally having an unsubstituted or substituted alkyl group having 1 to 20 carbon atoms, $Y^1$ in Formula (D) is bonded to the benzene ring in $R^{13}$, and, in the benzene ring in $R^{13}$ bonded to $Y^1$, at least one of ring carbon atoms at 2- and 6-positions relative to the ring carbon atom bonded to $Y^1$ is bonded to a hydrogen atom,

[chem. 3]

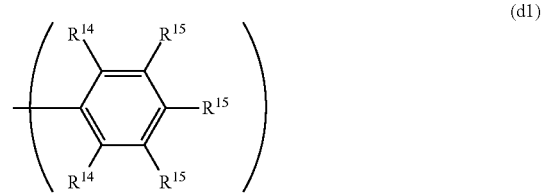

(d1)

wherein in Formula (d1), $R^{14}$'s are each independently a hydrogen atom, or an unsubstituted or substituted alkyl group having 1 to 20 carbon atoms, and at least one of $R^{14}$'s is a hydrogen atom; $R^{15}$'s are each independently a hydrogen atom, or an unsubstituted or substituted alkyl group having 1 to 20 carbon atoms.

[2] The photosensitive resin composition according to [1], wherein $R^1$ is an unsubstituted or substituted nitrogen-containing heteroaromatic ring.

[3] The photosensitive resin composition according to [2], wherein the nitrogen-containing heteroaromatic ring is an unsubstituted or substituted pyrimidine ring.

[4] The photosensitive resin composition according to any one of [1] to [3], wherein the compound (D) is contained in an amount of 0.01 to 20 parts by mass relative to 100 parts by mass of the polymer (A).

[5] A method for producing a resin film having a pattern, the method including: a step (1) of forming a coating film of the photosensitive resin composition according to any one of [1] to [4] on a substrate; a step (2) of selectively exposing the coating film; and a step (3) of developing the coating film after exposure with a developing solution containing an organic solvent.

[6] A resin film having a pattern, the resin film being formed by the production method according to [5].

[7] A semiconductor circuit substrate including the resin film having a pattern according to [6].

Advantageous Effects of Invention

The present invention can provide a photosensitive resin composition that can form an insulating film having low dielectric constant and low dielectric loss tangent and undergoing small changes in elongation properties in response to changes in environmental temperature; a patterned resin film having low dielectric constant and low dielectric loss tangent and undergoing small changes in elongation properties in response to changes in environmental temperature, and a method for producing the patterned resin film; and a semiconductor circuit substrate including the patterned resin film.

BRIEF DESCRIPTION OF DRAWING

FIG. 1 illustrates one cycle of the oven set temperature in the elongation evaluation in Examples.

DESCRIPTION OF EMBODIMENTS

Hereinafter, embodiments of the present invention will be explained together with suitable aspects.

[Photosensitive Resin Composition]

A photosensitive resin composition of the present invention (hereinafter, also referred to as "composition of the present invention") contains a polymer (A), a crosslinking agent (B), a photocation generator (C), and a compound (D) represented by Formula (D) explained below.

<Polymer (A)>

<<Structural Unit (a1)>>

The polymer (A) has a structural unit (a1) represented by Formula (a1). The polymer (A) may have one type of structural unit (a1) or may have two or more types of structural units (a1).

[chem. 4]

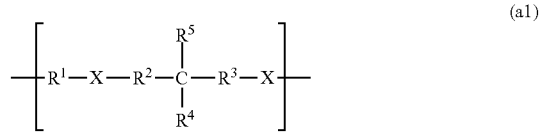

(a1)

In Formula (a1), $R^1$ is an unsubstituted or substituted nitrogen-containing heteroaromatic ring or an unsubstituted or substituted aromatic hydrocarbon ring. $R^2$ and $R^3$ are each independently an unsubstituted or substituted aromatic hydrocarbon ring. $R^4$ is an unsubstituted or substituted alkyl group having 1 to 20 carbon atoms. $R^5$ is a hydrogen atom, or an unsubstituted or substituted alkyl group having 1 to 20 carbon atoms. X's are each independently an oxygen atom, a sulfur atom, an ester bond, an amide bond, or —$SO_2$—.

The patterned resin film containing the polymer (A) tends to have low dielectric constant and low dielectric loss tangent and is therefore useful as an insulating film of a high-frequency circuit substrate. The polymer (A) tends to have a small dipole moment in the minor axis direction of the structural unit (a1) (a direction perpendicular to the main chain direction of the polymer (A)) and may thus have such low dielectric characteristics.

($R^1$)

$R^1$ is an unsubstituted or substituted nitrogen-containing heteroaromatic ring or an unsubstituted or substituted aromatic hydrocarbon ring. $R^1$ is preferably an unsubstituted or substituted nitrogen-containing heteroaromatic ring. The unsubstituted or substituted nitrogen-containing heteroaromatic ring or aromatic hydrocarbon ring is usually a divalent group in which a ring atom of the heteroaromatic ring or hydrocarbon ring is bonded to X in Formula (a1).

Examples of the unsubstituted nitrogen-containing heteroaromatic ring include N-containing aromatic rings such as a pyrimidine ring, a pyrazine ring, a pyridazine ring, a pyridine ring, a pyrrole ring, and a pyrazole ring; N- and O-containing aromatic rings such as an isoxazole ring; and N- and S-containing aromatic rings such as an isothiazole ring.

The substituted nitrogen-containing heteroaromatic ring is a group in which at least one hydrogen atom of the nitrogen-containing heteroaromatic ring is substituted with another group (substituent). Examples of the substituent include halogen atoms; monovalent hydrocarbon groups having 1 to 20 carbon atoms such as alkyl groups, cycloalkyl groups, aryl groups, an allyl group, and a vinyl group; monovalent halogenated hydrocarbon groups having 1 to 20 carbon atoms; a nitro group; and a cyano group. The substituent is preferably not a functional group having high polarity such as a hydroxyl group, from the viewpoint of low dielectric characteristics. The carbon number of the hydrocarbon group and the halogenated hydrocarbon group is preferably 1 to 3. When the nitrogen-containing heteroaromatic ring has two or more substituents, the substituents may be the same or different from each other.

Among the nitrogen-containing heteroaromatic rings, an unsubstituted or substituted pyrimidine ring, pyrazine ring, or pyridazine ring is preferable, and an unsubstituted or substituted pyrimidine ring is more preferable, since the use of the composition of the present invention enables the formation of a patterned resin film having low dielectric constant and low dielectric loss tangent.

Examples of the unsubstituted aromatic hydrocarbon ring include a benzene ring; and benzo-fused rings such as a naphthalene ring, an anthracene ring, a tetracene ring, and a pentacene ring. The carbon number of the unsubstituted aromatic hydrocarbon ring is preferably 6 to 50, and more preferably 6 to 30.

The substituted aromatic hydrocarbon ring is a group in which at least one hydrogen atom of the aromatic hydrocarbon ring is substituted with another group (substituent). Examples of the substituent include monovalent hydrocarbon groups having 1 to 20 carbon atoms such as alkyl groups, cycloalkyl groups, aryl groups, and aralkyl groups. When the aromatic hydrocarbon ring has two or more substituents, the substituents may be the same or different from each other.

($R^2$ and $R^3$)

$R^2$ and $R^3$ are each independently an unsubstituted or substituted aromatic hydrocarbon ring. The unsubstituted or substituted aromatic hydrocarbon ring is a divalent group of which ring atoms of the hydrocarbon ring are bonded to other structural elements in Formula (a1), that is, —C($R^4$)($R^5$)— and X.

Examples of the unsubstituted aromatic hydrocarbon ring include a benzene ring; and benzo-fused rings such as a naphthalene ring, an anthracene ring, a tetracene ring, and a pentacene ring. The carbon number of the unsubstituted aromatic hydrocarbon ring is preferably 6 to 50, and more preferably 6 to 30.

The substituted aromatic hydrocarbon ring is a group in which at least one hydrogen atom of the aromatic hydrocarbon ring is substituted with another group (substituent). Examples of the substituent include monovalent hydrocarbon groups having 1 to 20 carbon atoms such as alkyl groups, cycloalkyl groups, aryl groups, and aralkyl groups. When the aromatic hydrocarbon ring has two or more substituents, the substituents may be the same or different from each other.

($R^4$ and $R^5$)

$R^4$ is an unsubstituted or substituted alkyl group having 1 to 20 carbon atoms. The carbon number of the alkyl group in $R^4$ is preferably 2 to 20, more preferably 3 to 18, and still more preferably 4 to 15. When $R^4$ is an alkyl group having 2 or more carbon atoms, the development of the coating film formed of the polymer (A) using an organic solvent tends to be improved.

Examples of the unsubstituted alkyl group in $R^4$ include a methyl group, an ethyl group, a propyl group, an isopropyl group, a butyl group, an isobutyl group, a sec-butyl group, a tert-butyl group, a pentyl group, a hexyl group, an octyl group, a nonyl group, a decyl group, and an undecyl group.

The substituted alkyl group in $R^4$ is a group in which at least one hydrogen atom of the alkyl group is substituted with another group (substituent). Examples of the substituent include monovalent hydrocarbon groups having 1 to 20 carbon atoms such as cycloalkyl groups, aryl groups, and aralkyl groups. When the alkyl group has two or more substituents, the substituents may be the same or different from each other.

$R^5$ is a hydrogen atom, or an unsubstituted or substituted alkyl group having 1 to 20 carbon atoms. The carbon number of the alkyl group in $R^5$ is preferably 1 to 10, and more preferably 1 to 5.

Examples of the unsubstituted alkyl group in $R^5$ include a methyl group, an ethyl group, a propyl group, an isopropyl group, a butyl group, an isobutyl group, a sec-butyl group, a tert-butyl group, a pentyl group, a hexyl group, an octyl group, a nonyl group, and a decyl group.

The substituted alkyl group in $R^5$ is a group in which at least one hydrogen atom of the alkyl group is substituted with another group (substituent). Examples of the substituent include monovalent hydrocarbon groups having 1 to 20 carbon atoms such as cycloalkyl groups, aryl groups, and aralkyl groups. When the alkyl group has two or more substituents, the substituents may be the same or different from each other.

The structure —$R^2$—C($R^4$)($R^5$)—$R^3$— in Formula (a1) is preferably a structure derived from a bisphenol represented by Formula (aa1).

[chem. 5]

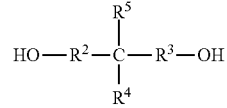

(aa1)

In Formula (aa1), $R^2$ to $R^5$ are respectively synonymous with the same symbols in Formula (a1).

(X)

X's are each independently an oxygen atom, a sulfur atom, an ester bond, an amide bond, or —$SO_2$—. Among these, an oxygen atom and an ester bond are preferable, since the use of the composition of the present invention enables the formation of a patterned resin film that has low dielectric constant and low dielectric loss tangent and is superior in elongation properties, and the polymer (A) is superior in solubility in an organic solvent and preservation stability.

(Content Ratio of Structural Unit (a1))

The content ratio of the structural unit (a1) in the polymer (A) is usually 30% by mass or more, preferably 50% by mass or more, and more preferably 70% by mass or more, based on 100% by mass of the polymer (A).

Alternatively, the content ratio of the structural unit (a1) in the polymer (A) is usually 30 mol % or more, preferably 50 mol % or more, and more preferably 70 mol % or more, based on 100 mol % of all the structural units of the polymer (A). In this case, the "structural unit" refers to, when the polymer (A) is produced by polycondensation, a structure formed from a pair of monomers.

In such an aspect, the photosensitive resin composition tends to be superior in resolution properties, and a resin film obtained from the photosensitive resin composition tends to have low dielectric constant and low dielectric loss tangent and be superior in elongation properties, and undergo small changes in elongation properties in response to changes in environmental temperature. The content ratio of the structural unit (a1) can be measured by $^{13}$C-NMR.

<<Other Structural Units>>

The polymer (A) can further have a structural unit other than the structural unit (a1). Examples of the structural unit include a structural unit (a2) represented by Formula (a2).

[chem. 6]

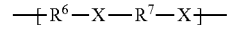

(a2)

In Formula (a2), $R^6$ is an unsubstituted or substituted nitrogen-containing heteroaromatic ring or an unsubstituted or substituted aromatic hydrocarbon ring; $R^7$ is an unsubstituted or substituted aromatic hydrocarbon ring; and X's are each independently an oxygen atom, a sulfur atom, an ester bond, an amide bond, or —$SO_2$—.

<<Terminal Group>>

The polymer (A) preferably has a terminal group (g1) represented by Formula (g1). The polymer (A) may have one type of terminal group (g1) or may have two or more types of terminal groups (g1).

[chem. 7]

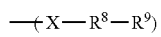

(g1)

In Formula (g1), X is an oxygen atom, a sulfur atom, an ester bond, an amide bond, or —SO$_2$—. R$^8$ is a divalent group having an unsubstituted or substituted aromatic hydrocarbon ring. R$^9$ is a reactive group that reacts with the crosslinking agent (B) by action of a cation generated from the photocation generator (C) upon light irradiation. The cation facilitates a crosslinking reaction between the polymer (A) and the crosslinking agent (B).

The unsubstituted or substituted aromatic hydrocarbon ring in R$^8$ is preferably a divalent group of which ring atoms of the hydrocarbon ring are bonded to other structural elements in Formula (g1), that is, X and R$^9$. R$^8$ is preferably a divalent group represented by —R$^2$—C(R$^4$)(R$^5$)—R$^3$—. In the formula, R$^2$ to R$^5$ are respectively synonymous with the same symbols in Formula (a1).

Whether R$^9$ is the reactive group can be determined based on the type of the crosslinking agent (B). Examples of the reactive group include a phenolic hydroxyl group, a thiol group, an amino group, and a carboxy group. The reactive group is preferably a phenolic hydroxyl group, since the use of the composition of the present invention enables the formation of a patterned resin film that has low dielectric constant and low dielectric loss tangent and is superior in elongation properties, and the polymer (A) is superior in solubility in an organic solvent and preservation stability.

The terminal group (g1) can be qualitatively or quantitatively analyzed by combining a matrix assisted laser desorption/ionization method, a three-dimensional nuclear magnetic resonance method, and a titration method, for example.

The polymer (A) having the terminal group (g1) is preferable from the viewpoint of the elongation properties of the obtained patterned resin film. The polymer (A) has the reactive group at a polymer chain terminal. When the composition containing the polymer (A) is subjected to a crosslinking treatment, crosslinking occurs such that the polymer chain in the polymer (A) is chain-extended. It is accordingly considered that the crosslinking density is low, while the polymer chains are entangled greatly, leading to the occurrence of mild interaction between polymer chains. As such, the patterned resin film tends to have improved elongation properties.

Since crosslinking mainly occurs at the polymer chain terminal of the polymer (A) having the terminal group (g1), it is assumed that change in the dipole moment in the minor axis direction of the structural unit (a1) is small during the formation of the patterned resin film.

<<Preferable Configurations>>

The polymer (A) is preferably a linear polymer that has a structural unit (a1) and that has the terminal group (g1) at a polymer chain terminal since the use of the composition of the present invention enables the formation of a patterned resin film that is superior in elongation properties.

The weight average molecular weight (Mw) of the polymer (A) measured by a gel permeation chromatography method is usually 1,000 to 200,000, preferably 2,000 to 100,000, and still more preferably 5,000 to 100,000 in terms of polystyrene from the viewpoint of resolution properties of the photosensitive resin composition and elongation properties of the resin film obtained from the photosensitive resin composition. The details of the measurement method of Mw are as described in Example.

The composition of the present invention can contain one type or two or more types of polymers (A).

The lower limit value of the content ratio of the polymer (A) is usually 20% by mass, preferably 40% by mass, and more preferably 60% by mass; and the upper limit value thereof is usually 99% by mass, and preferably 95% by mass, based on 100% by mass of the solid component of the composition of the present invention. When the content ratio of the polymer (A) is the lower limit value or more or the upper limit value or less, a photosensitive resin composition that can form a patterned resin film having high resolution tends to be obtained. The solid component refers to all components that can be contained in the composition of the present invention and exclude an organic solvent (E) described later.

<<Method for Producing Polymer (A)>>

The polymer (A) can be, for example, produced by polycondensation. For example, the polymer (A) can be produced by using a bisphenol compound and a dihalogen compound as monomers when X is an oxygen atom in Formula (a1), a bisthiol compound and a dihalogen compound as monomers when X is a sulfur atom, and a dicarboxylic acid compound and a dihalogen compound as monomers when X is an ester bond.

Hereinafter, as an example of the polymer (A), a polymer (A11) in which X in Formula (a1) is an oxygen atom and the reactive group is a phenolic hydroxyl group will be explained. The polymer (A11) can be obtained by polymerizing, for example, at least a bisphenol represented by Formula (aa1) and a halogen compound represented by Formula (aa2): Hal-R$^1$-Hal (wherein R$^1$ is synonymous with the same symbol in Formula (a1), and Hal is a halogen atom).

In synthesis of the polymer (A11), for example, the bisphenol and the halogen compound are polymerized in an appropriate polymerization solvent in the presence of an alkali metal compound. The amount of the halogen compound used is preferably less than 100 mol, and more preferably 90.0 to 99.9 mol, based on 100 mol of the bisphenol. Such an amount ratio allows a polymer having a phenolic hydroxyl group at a polymer terminal to be obtained.

Examples of the alkali metal compound include carbonates, hydrogen carbonates, and hydroxides of alkali metals such as lithium, sodium, and potassium. Among these, carbonates and hydroxides are preferable, and potassium carbonate, sodium carbonate, potassium hydroxide, and sodium hydroxide are more preferable.

Other polymers (A) can be produced by, for example, known polycondensation methods.

<Crosslinking Agent (B)>

The composition of the present invention further contains a crosslinking agent (B) for the purpose of, for example, improving the curability of the patterned resin film. The crosslinking agent (B) is, for example, a crosslinking component that reacts with each other or, in a suitable aspect, reacts with the reactive group in the polymer (A) by action of a cation generated from the photocation generator (C) upon light irradiation.

Examples of the crosslinking agent (B) include a crosslinking agent (b1) having at least two groups represented by —$R^{B1}$—O—$R^{B2}$ such as a methylol group and an alkoxymethyl group, a crosslinking agent having at least two oxetane rings, a crosslinking agent having at least two oxirane rings, a crosslinking agent having at least two oxazoline rings, a crosslinking agent having at least two isocyanate groups (including blocked isocyanate), and a crosslinking agent having at least two maleimide groups. Among these, the crosslinking agent (b1) is preferable.

In the formula in the crosslinking agent (b1), $R^{B1}$ is an alkanediyl group, and preferably an alkanediyl group having 1 to 10 carbon atoms; and $R^{B2}$ is a hydrogen atom or an alkyl group, and preferably a hydrogen atom or an alkyl group having 1 to 10 carbon atoms.

Examples of the alkanediyl group in $R^{B1}$ include a methylene group and an ethylene group, and examples of the alkyl group in $R^{B2}$ include a methyl group, an ethyl group, a propyl group, and a butyl group.

Examples of the crosslinking agent (b1) include compounds having two or more of an amino group to which a group represented by —$R^{B1}$—O—$R^{B2}$ is bonded, methylol group-containing phenolic compounds, and alkylmethylol group-containing phenolic compounds.

Examples of the amino group to which a group represented by —$R^{B1}$—O—$R^{B2}$ is bonded include groups represented by Formula (b1-1) and groups represented by Formula (b1-2).

[chem. 8]

(b1-1)

(b1-2)

In Formula (b1-1) and Formula (b1-2), $R^{B1}$ is an alkanediyl group having 1 to 10 carbon atoms, $R^{B2}$ is a hydrogen atom or an alkyl group having 1 to 10 carbon atoms, m is 1 or 2, n is 0 or 1, m+n is 2, and * is a bonding hand.

Examples of the crosslinking agent (b1) include nitrogen atom-containing compounds such as polymethylol melamine, polymethylol glycoluril, polymethylol guanamine, and polymethylol urea; and compounds obtained by alkyl etherification of all or part of active methylol groups ($CH_2OH$ groups each bonded to an N atom) in the nitrogen atom-containing compound. Alkyl groups constituting the alkyl ether may be, for example, a methyl group, an ethyl group, a propyl group, or a butyl group, and may be the same or different from each other. Further, active methylol groups that are not alkyl-etherified may be self-condensed in one molecule, or may be condensed between two molecules, resulting in the formation of an oligomer component.

Specific examples of the crosslinking agent (b1) include crosslinking agents described in JP H6-180501 A, JP 2006-178059 A, and JP 2012-226297 A. Specific examples include melamine-based crosslinking agents such as polymethylol melamine, hexamethoxymethyl melamine, hexaethoxymethyl melamine, hexapropoxymethyl melamine, and hexabutoxymethyl melamine; glycoluril-based crosslinking agents such as polymethylol glycoluril, tetramethoxymethyl glycoluril, and tetrabutoxymethyl glycoluril; and guanamine-based crosslinking agents including compounds obtained by methylolation of guanamines such as 3,9-bis[2-(3,5-diamino-2,4,6-triazaphenyl)ethyl]2,4,8,10-tetraoxospiro[5.5]undecane and 3,9-bis[2-(3,5-diamino-2,4,6-triazaphenyl)propyl]2,4,8,10-tetraoxospiro[5.5]undecane, and compounds obtained by alkyl etherification of all or part of active methylol groups in the compounds obtained by methylolation of guanamines described above.

Examples of methylol group-containing phenolic compounds and alkylmethylol group-containing phenolic compounds include 2,6-dimethoxymethyl-4-t-butylphenol and 2,6-dimethoxymethyl-p-cresol.

The composition of the present invention can contain one type or two or more types of crosslinking agents (B).

The lower limit value of the content of the crosslinking agent (B) is usually 0.1 parts by mass, preferably 1 part by mass, and more preferably 2 parts by mass; and the upper limit value thereof is usually 40 parts by mass, preferably 30 parts by mass, and more preferably 20 parts by mass, based on 100 parts by mass of the polymer (A) in the composition of the present invention. When the content of the crosslinking agent (B) is equal to or more than the lower limit value or equal to or less than the upper limit value, a patterned resin film that is superior in resolution and heat resistance tends to be formed.

<Photocation Generator (C)>

The composition of the present invention contains a photocation generator (C). The photocation generator (C) is a compound that generates a cation such as $H^+$ upon light irradiation, for example, for facilitating a crosslinking reaction between molecules of the crosslinking agent (B) or, in a suitable aspect, a crosslinking reaction between the reactive group in the polymer (A) and the crosslinking agent (B).

It is considered that an exposure treatment on a coating film formed of the composition of the present invention allows a cation to be generated from the photocation generator (C) at an exposed portion, and the action of the cation facilitates the crosslinking reaction to form a crosslinking structure at the exposed portion, leading to decrease in solubility in a developing solution.

The photocation generator (C) is preferably a photosensitive acid generator that generates an acid upon light irradiation, and examples include onium salt compounds, halogen-containing compounds, sulfone compounds, sulfonic acid compounds, sulfonimide compounds, and diazomethane compounds.

Specific examples of the onium salt compounds, the halogen-containing compounds, the sulfone compounds, sulfonic acid compounds, the sulfonimide compounds, and the diazomethane compounds include the compounds described in paragraphs [0074] to [0079] in JP 2014-186300 A. These compounds are regarded as described in the present specification. Specific examples include the photocation generator represented by Formula (C1) in the section of Examples.

The composition of the present invention can contain one type or two or more types of photocation generators (C).

The lower limit value of the content of the photocation generator (C) is usually 0.01 parts by mass, preferably 0.1 parts by mass, and more preferably 0.5 parts by mass; and the upper limit value thereof is usually 30 parts by mass, preferably 20 parts by mass, and more preferably 10 parts by mass, based on 100 parts by mass of the polymer (A) in the composition of the present invention. When the content of the photocation generator (C) is the lower limit value or more, curing at an exposed portion is sufficient, and a patterned resin film tends to have improved heat resistance. When the content of the photocation generator (C) is the upper limit value or less, the transparency to light for use in exposure does not deteriorate, and a patterned resin film having high resolution tends to be obtained.

<Compound (D)>

The composition of the present invention contains a compound (D) represented by Formula (D).

The investigations made by the present inventors reveal that, although the elongation properties of the patterned resin film formed of the polymer (A) having the structural unit (a1) are degraded by exposure to a harsh environment, the use of the compound (D) having a particular structure improves the resistance of the elongation properties. The reason for this is unclear.

[chem. 9]

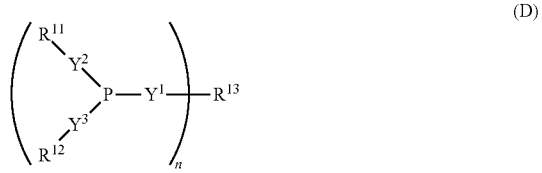

(D)

In Formula (D), $Y^1$ to $Y^3$ are each independently a single bond or an oxygen atom. $R^{11}$ and $R^{12}$ are each independently a hydrogen atom, an alkyl group, or a monovalent group represented by Formula (d1). $R^{13}$ is described below. n is an integer of 1 to 10, and preferably 1 or 2.

The carbon number of the alkyl group in $R^{11}$ and $R^{12}$ is usually 1 to 20, and preferably 1 to 16. Examples of the alkyl group include a methyl group, an ethyl group, a propyl group, an isopropyl group, a butyl group, an isobutyl group, a sec-butyl group, a tert-butyl group, a pentyl group, a hexyl group, an octyl group, an isooctyl group, a 2-ethylhexyl group, a nonyl group, a decyl group, an isodecyl group, a dodecyl group, a tridecyl group, a tetradecyl group, and a hexadecyl group.

[chem. 10]

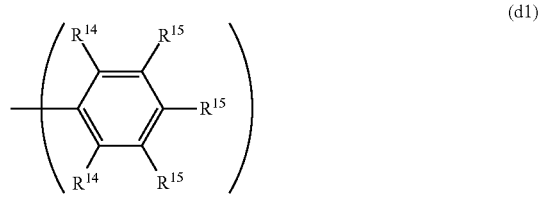

(d1)

In Formula (d1), $R^{14}$'s are each independently a hydrogen atom, or an unsubstituted or substituted alkyl group having 1 to 20 carbon atoms, and at least one of $R^{14}$'s is a hydrogen atom; $R^{15}$'s are each independently a hydrogen atom, or an unsubstituted or substituted alkyl group having 1 to 20 carbon atoms.

The carbon number of the alkyl group in $R^{14}$ and $R^{15}$ is usually 1 to 20, preferably 1 to 10, and more preferably 1 to 5. Examples of the alkyl group include a methyl group, an ethyl group, a propyl group, an isopropyl group, a butyl group, an isobutyl group, a sec-butyl group, a tert-butyl group, a pentyl group, a hexyl group, an octyl group, a nonyl group, and a decyl group.

The substituted alkyl group is a group in which at least one hydrogen atom of the alkyl group is substituted with another group. Examples of the substituent include monovalent hydrocarbon groups having 1 to 20 carbon atoms such as cycloalkyl groups, aryl groups, and aralkyl groups. When the alkyl group has two or more substituents, the substituents may be the same or different from each other.

When n is 1, $R^{13}$ is a hydrogen atom, an alkyl group, or a monovalent group represented by Formula (d1), and at least one of $R^{11}$ to $R^{13}$ is a monovalent group represented by Formula (d1). $R^{11}$ to $R^{13}$ are each preferably a monovalent group represented by Formula (d1). Examples of the alkyl group include the same groups as the alkyl groups in $R^{11}$ and $R^{12}$.

When n is an integer of 2 to 10, $R^{13}$ is an n-valent organic group having at least one benzene ring optionally having an unsubstituted or substituted alkyl group having 1 to 20 carbon atoms, $Y^1$ in Formula (D) is bonded to the benzene ring in $R^{13}$, and, in the benzene ring in $R^{13}$ bonded to $Y^1$, at least one of the ring carbon atoms at 2- and 6-positions relative to the ring carbon atom bonded to $Y^1$ is bonded to a hydrogen atom.

When the benzene ring has two or more alkyl groups, the alkyl groups may be the same or different from each other. Examples of the alkyl group include the same groups as the alkyl groups in $R^{14}$ and $R^{15}$.

The n-valent organic group usually has 1 to 5 benzene rings, and preferably has 2 benzene rings. When n is 2, the divalent organic group is preferably, for example, a group represented by -Ph-R-Ph-. Ph's are each independently an unsubstituted or substituted phenylene group (satisfying the requirements for ring carbon atoms described above), and R is a single bond or a divalent hydrocarbon group.

The carbon number of the divalent hydrocarbon group is usually 1 to 10, and preferably 2 to 5. Examples of the divalent hydrocarbon group include alkanediyl groups, cycloalkanediyl groups, and these groups in which at least one hydrogen atom is substituted with an aryl group.

Although the reason is unclear, in the benzene ring bonded to the phosphorus atom (P) directly or via an oxygen atom, the presence of bulky groups at 2- and 6-positions results in insufficient improvement in the resistance of the elongation properties, but the presence of a hydrogen atom at at least one of 2- and 6-positions as in Formula (d1) or the benzene ring tends to sufficiently improve the resistance of the elongation properties.

Examples of the compound (D) include
phosphine compounds such as triphenylphosphine, tri-o-tolylphosphine, tri-m-tolylphosphine, tri-p-tolylphosphine, and tri-2,4-dimethylphenyl phosphine; and
phosphite compounds such as triphenyl phosphite, tris (methylphenyl) phosphite, tris(nonylphenyl) phosphite, tris(2,4-di-t-butylphenyl) phosphite, tris(2,4-dinonylphenyl) phosphite, phenyl di(isodecyl) phosphite, phenyl di(tridecyl) phosphite, diphenyl (2-ethylhexyl) phosphite, diphenyl isooctyl phosphite, diphenyl isodecyl phosphite, diphenyl tridecyl phosphite, phenyl isooctyl phosphite, phenyl isodecyl phosphite, tetraalkyl-4,4'-isopropylidene diphenyl diphosphite, 4,4'-butylidenebis(3-methyl-6-t-butylphenyl ditridecylphosphite), and tetrakis(2,4-di-t-butylphenyl)-4, 4'-biphenylene diphosphite.

The composition of the present invention can contain one type or two or more types of compounds (D).

The lower limit value of the content of the compound (D) is usually 0.01 parts by mass, preferably 0.05 parts by mass, and more preferably 0.1 parts by mass; and the upper limit value thereof is usually 20 parts by mass, preferably 15 parts by mass, and more preferably 10 parts by mass, based on 100 parts by mass of the polymer (A) in the composition of the present invention. When the content of the compound (D) is the lower limit value or more, the advantageous effect described above tends to be obtained.

<Organic Solvent (E)>

The composition of the present invention preferably contains an organic solvent (E). The use of the organic solvent (E) can improve handleability and adjust viscosity and preservation stability of the composition of the present invention.

The organic solvent (E) is not particularly limited as long as it can dissolve or disperse the components described above. Examples of the organic solvent (E) include ketone solvents, alcohol solvents, ether solvents, ester solvents, amide solvents, and hydrocarbon solvents.

Examples of the ketone solvents include linear ketone solvents such as acetone, methyl ethyl ketone, methyl-n-propyl ketone, methyl-n-butyl ketone, diethyl ketone, methyl-iso-butyl ketone, 2-heptanone (methyl amyl ketone), ethyl-n-butyl ketone, methyl-n-hexyl ketone, di-iso-butyl ketone, and trimethyl nonanone; cyclic ketone solvents such as cyclopentanone, cyclohexanone, cycloheptanone, cyclooctanone, and methylcyclohexanone; 2,4-pentanedione, acetonylacetone, and acetophenone.

Examples of the alcohol solvents include aliphatic monoalcohol solvents having 1 to 18 carbon atoms such as 4-methyl-2-pentanol and n-hexanol; alicyclic monoalcohol solvents having 3 to 18 carbon atoms such as cyclohexanol; polyalcohol solvents having 2 to 18 carbon atoms such as 1,2-propylene glycol; and polyalcohol partial ether solvents having 3 to 19 carbon atoms such as propylene glycol monomethyl ether.

Examples of the ether solvents include dialkyl ether solvents such as diethyl ether, dipropyl ether, dibutyl ether, dipentyl ether, diisoamyl ether, dihexyl ether, and diheptyl ether; cyclic ether solvents such as tetrahydrofuran and tetrahydropyran; and aromatic ring-containing ether solvents such as diphenyl ether and anisole.

Examples of the ester solvents include monocarboxylate solvents such as n-butyl acetate and ethyl lactate; polyalcohol carboxylate solvents such as propylene glycol acetate; polyalcohol partial ether carboxylate solvents such as propylene glycol monomethyl ether acetate; polycarboxylic acid diester solvents such as diethyl oxalate; lactone solvents such as γ-butyrolactone and 67-valerolactone; and carbonate solvents such as dimethyl carbonate, diethyl carbonate, ethylene carbonate, and propylene carbonate.

Examples of the amide solvents include cyclic amide solvents such as N,N'-dimethyl imidazolidinone and N-methyl-2-pyrrolidone; and linear amide solvents such as N-methylformamide, N,N-dimethylformamide, N,N-diethylformamide, acetamide, N-methylacetamide, N,N-dimethylacetamide, and N-methylpropionamide.

Examples of the hydrocarbon solvents include aliphatic hydrocarbon solvents having 5 to 12 carbon atoms such as n-pentane and n-hexane; and aromatic hydrocarbon solvents having 6 to 16 carbon atoms such as toluene and xylene.

The organic solvent (E) is preferably at least one type selected from the ketone solvents, the ester solvents, and the amide solvents.

The composition of the present invention can contain one type or two or more types of organic solvents (E).

The content of the organic solvent (E) in the composition of the present invention is set such that the solid component concentration in the composition is usually 10 to 50% by mass.

<Other Components>

The composition of the present invention can contain, in addition to each of the components described above, other components to such an extent as not to impair the object and characteristics of the present invention. Examples of the other components include polymers other than the polymer (A); and additives such as low-molecular weight phenolic compounds, adhesion aids, crosslinked fine particles, leveling agents, surfactants, sensitizers, inorganic fillers, and quenchers.

The molecular weight of the low-molecular weight phenolic compound is usually 1000 or less, and preferably 800 or less. When a low-molecular weight phenolic compound is used, the lower limit value of the content of the low-molecular weight phenolic compound is usually 1 part by mass; and the upper limit value thereof is usually 50 parts by mass, based on 100 parts by mass of the polymer (A) in the composition of the present invention.

Examples of the surfactant include fluorine-based surfactants, silicone-based surfactants, and polyalkylene oxide-based surfactants. When a surfactant is used, the lower limit value of the content of the surfactant is usually 0.0001 parts by mass; and the upper limit value thereof is usually 1 part by mass, based on 100 parts by mass of the polymer (A) in the composition of the present invention.

<Method for Producing Photosensitive Resin Composition>

The composition of the present invention can be produced by uniformly mixing respective components constituting the composition of the present invention. To remove foreign matters, the respective components are uniformly mixed, and then the obtained mixture can be filtered with a filter or the like.

[Method for Producing Resin Film Having Pattern]

A method for producing a resin film having a pattern (patterned resin film) of the present invention includes: a step (1) of forming a coating film of a composition of the present invention on a substrate; a step (2) of selectively exposing the coating film; and a step (3) of developing the coating film after exposure with a developing solution containing an organic solvent.

<Step (1)>

In the step (1), the composition of the present invention is usually applied on a substrate such that the thickness of the finally obtained patterned resin film is, for example, 0.1 to 100 μm. The substrate after coating with the composition is usually heated at 50 to 140° C. for 10 to 360 seconds using an oven or a hotplate. In this manner, a coating film composed of the composition of the present invention is formed on the substrate.

Examples of the substrate include a silicon wafer, a compound semiconductor wafer, a wafer with a metal thin film, a glass substrate, a quartz substrate, a ceramic substrate, and an aluminum substrate; and a substrate having a semiconductor chip on the surface of each of these substrates. Examples of the coating method include a dipping method, a spray method, a bar coating method, a roll coating method, a spin coating method, a curtain coating method, a gravure printing method, a silk screen method, and an inkjet method.

<Step (2)>

In the step (2), the coating film is selectively exposed using, for example, a contact aligner, a stepper, or a scanner.

"Selectively" specifically means "via a photomask on which a predetermined mask pattern is formed".

Examples of light for exposure include ultraviolet light and visible light. Usually, light having a wavelength of 200 to 500 nm (e.g. i-ray (365 nm)) is used. The irradiation amount by exposure is usually 100 to 1500 mJ/cm$^2$, although the exposure amount varies depending on the kinds of respective components in the composition of the present invention, the blending ratio of the components, and the thickness of the coating film.

In order to sufficiently proceed with a crosslinking reaction, a heating treatment (after-exposure baking) is preferably performed after exposure. The condition of the heating treatment after exposure is usually 70 to 250° C., and preferably 80 to 200° C., for about 1 to 60 minutes, although it varies depending on the contents of respective components in the composition of the present invention and the thickness of the coating film.

<Step (3)>

In the step (3), the coating film after exposure is developed with a developing solution containing an organic solvent, and an unexposed portion is dissolved and removed to form a desired patterned resin film on the substrate. Examples of the development method include a shower development method, a spray development method, an immersion development method, and a paddle development method. The condition of the development is usually at 20 to 40° C. for about 1 to 10 minutes.

The developing solution contains one types or two or more types of organic solvents. A coating film composed of the composition of the present invention can be developed with a developing solution containing an organic solvent. Examples of the developing solution include organic solvents such as ketone solvents, alcohol solvents, ether solvents, ester solvents, amide solvents, and hydrocarbon solvents, or solutions containing these organic solvents. Specific examples of these organic solvents include compounds exemplified as the organic solvent (E). Among these, at least one type selected from the ketone solvents, the ester solvents, and the amide solvents is preferable. Examples of components other than the organic solvent in the developing solution include water, a silicone oil, and a surfactant.

The content ratio of the organic solvent in the developing solution is preferably 80% by mass or more, more preferably 90% by mass or more, still more preferably 95% by mass or more, and specifically preferably 99% by mass or more.

After the coating film after exposure is developed with a developing solution containing an organic solvent to form a patterned resin film, the patterned resin film can be washed with water, for example and dried.

The shape of the pattern in the patterned resin film is not particularly limited as long as it has a recess and projection structure, and examples include a line and space pattern, a dot pattern, a hole pattern, and a lattice pattern.

<Step (4)>

After the step (3), the method for producing a patterned resin film of the present invention can have, as needed, a step (4) of sufficiently curing the patterned resin film by a heating treatment (post-baking) in order to sufficiently exhibit the characteristics as an insulating film. The condition of the curing is not particularly limited, and the patterned resin film is heated, for example, at a temperature of 100 to 250° C. for about 30 minutes to 10 hours, according to the use of the patterned resin film.

The patterned resin film obtained by the production method of the present invention can be suitably used as an insulating film (e.g. surface protection film, interlayer insulating film, and flattened film) of a semiconductor circuit substrate.

[Semiconductor Circuit Substrate]

The use of the composition of the present invention enables a semiconductor circuit substrate containing the resin film having a pattern (patterned resin film) described above to be produced. The semiconductor circuit substrate has a patterned resin film, and preferably has a patterned insulating film such as a surface protection film, an interlayer insulating film, and a flattened film, formed of the composition of the present invention described above, and is therefore useful as a high-frequency circuit substrate.

EXAMPLES

Hereinafter, the present invention will be further specifically explained with reference to Examples; however, it is not limited to these Examples. In the following description of Examples or the like, "part" means "part by mass" unless otherwise noted.

<1> Synthesis of Polymer (A)

<1-1> Method for Measuring Weight Average Molecular Weight (Mw) of Polymer (A)

Mw was measured by a gel permeation chromatography method in the following conditions.

Column: product name "TSKgelα-M" (manufactured by Tosoh Corporation)

Solvent: N-methyl-2-pyrrolidone

Temperature: 40° C.

Detection method: refractive index method

Standard material: polystyrene

GPC apparatus: apparatus name "HLC-8320-GPC" manufactured by Tosoh Corporation

<1-2> Synthesis of Polymer (A)

[Synthesis Example 1] Synthesis of Polymer (A1)

To a four-neck flask were added 145.00 mmol of 4,6-dichloropyrimidine as a dihalogen compound, 75.00 mmol of bisphenol A and 75.00 mmol of 1,1-bis(4-hydroxyphenyl)decane as phenolic compounds, 0.20 mol of potassium carbonate as an alkali metal compound, and N-methyl-2-pyrrolidone (0.5 g based on 1 mmol of the total amount of the halogen compound and the phenolic compound) as a polymerization solvent. The inside of the flask was purged with nitrogen. Thereafter, the contents in the flask were heated at 130° C. for 6 hours, and water generated during the heating was removed from a Dean-Stark tube as required. The contents in the flask were cooled to the room temperature. Thereafter, the deposited solid matters were filtered out, methanol was added to the filtrate, the deposited solid matters were washed with methanol, and these solid matters were dried to obtain a polymer (A1). The obtained polymer (A1) was analyzed by $^{13}$C-NMR, for example, and it was revealed to be a polymer having a structure represented by Formula (A1). The weight average molecular weight (Mw) of the polymer (A1) was 20,000.

[chem. 11]

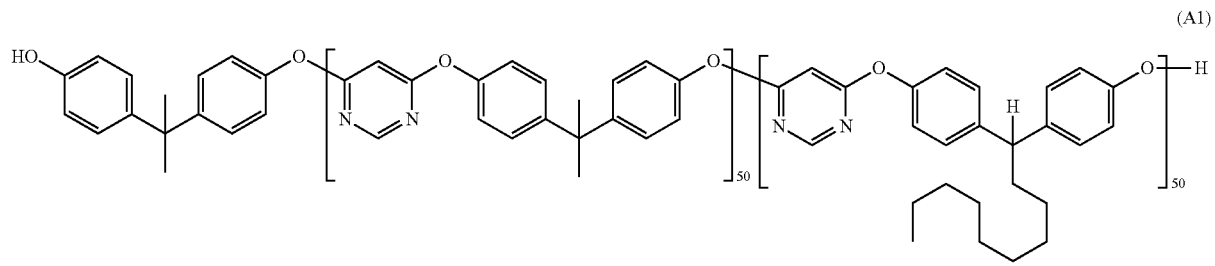

(A1)

The subscript of the bracket indicates the content ratio (mol %) of the structural unit in the bracket.

<2> Production of Photosensitive Resin Composition

Examples 1 to 3 and Comparative Examples 1 to 3

The photosensitive resin compositions of Examples 1 to 3 and Comparative Examples 1 to 3 were produced by uniformly mixing the polymer (A), the crosslinking agent (B), the photocation generator (C), the compounds (D), and other components shown in Table 1 in the amounts shown in Table 1 to achieve solid component concentrations shown in Table 1 using the organic solvents (E) shown in Table 1.

The details of respective components used in production of the photosensitive resin composition are shown as below.

(A1): polymer (A1) polymerized in Synthesis Example 1
(B1): hexamethoxymethyl melamine
(trade name "cymel 300", manufactured by Mitsui Chemicals, Inc.)
(C1): a photocation generator represented by Formula (C1)

[chem. 12]

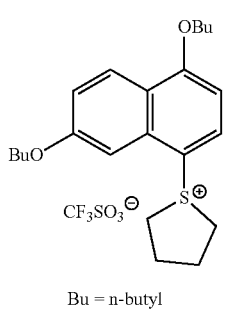

(C1)

Bu = n-butyl (D1): a compound (D1) represented by Formula (D1)
(trade name "ADEKA STAB 1500", manufactured by ADEKA Corporation, R in Formula (D1) is a C12-C15 alkyl group)

[chem. 13]

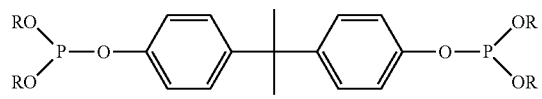

(D1)

(D2): a compound (D2) represented by Formula (D2)
(trade name "TOTP", manufactured by Hokko Chemical Industry)

[chem. 14]

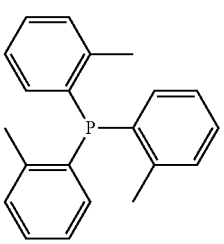

(D2)

(d1): a compound (d1) represented by Formula (d1)
(trade name "Irganox 1010", manufactured by BASF Japan Ltd.)

[chem. 15]

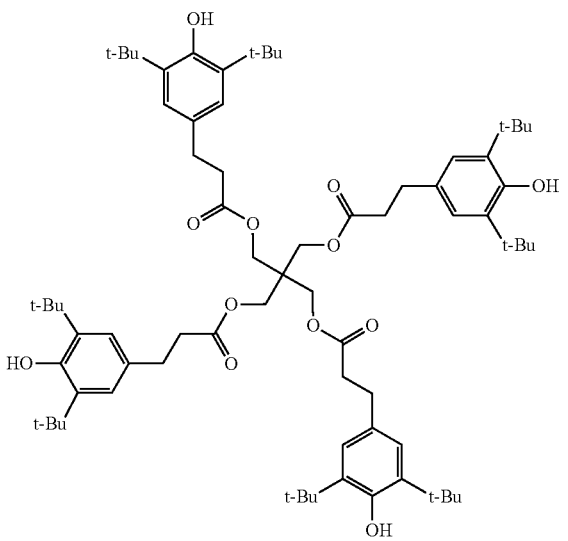

(d1)

(E1): cyclohexanone
(E2): methyl amyl ketone
(F1): a low-molecular weight phenolic compound represented by Formula (F1)

[chem. 16]

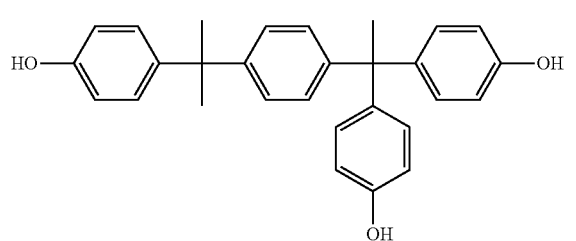

(F1)

(F2): a fluorine-based surfactant, trade name "MEGA-FACE F-563" (manufactured by DIC Corporation)
(F3): a compound (F3) represented by Formula (F3)

[chem. 17]

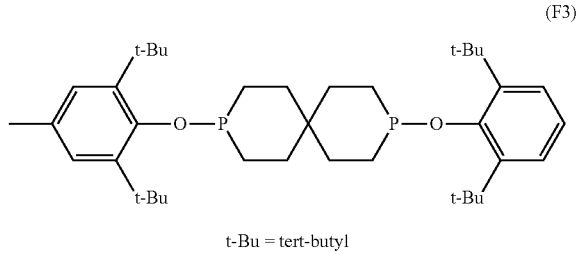

(F3)

t-Bu = tert-butyl of 365 nm was 500 mJ/cm². Next, the coating film after exposure was heated with a hotplate at 150° C. for 3 minutes in a nitrogen atmosphere, and subsequently developed by immersion in cyclopentanone at 23° C. for 3 minutes. The coating film after development was heated with an oven at 200° C. for 1 hour in a nitrogen atmosphere to produce a resin film having a pattern. The produced resin film having a pattern was observed with an electron microscope and evaluated based on the following criteria.

AA: A pattern with a cube shape having 50 μm length, 50 μm width, and 6 μm height was able to be formed.

BB: A pattern with a cube shape having 50 μm length, 50 μm width, and 6 μm height was not able to be formed.

<3-2> Elongation

Each of the photosensitive resin compositions was applied on a substrate having a mold release material and then heated with an oven at 110° C. for 5 minutes to prepare a coating film. Next, the entire surface of the coating film was irradiated with ultraviolet light from a high-pressure mercury lamp using an aligner (manufactured by Suss Microtec SE, model "MA-150") such that the exposure amount at a wavelength of 365 nm was 500 mJ/cm². Next, the coating film after exposure was heated with a hotplate at 150° C. for 3 minutes in a nitrogen atmosphere and further heated with an oven at 200° C. for 1 hour in a nitrogen atmosphere.

The coating film after heating was released from the substrate having a mold release material to obtain a resin film having a thickness of 15 μm. The obtained resin film was cut into a strip shape having 2.5 cm length×0.5 cm width. The tensile elongation at break (%) of the strip-shaped resin film (specimen) was taken as an "elongation (initial value)" and measured by a tensile compression

TABLE 1

| Components | | Example 1 | Example 2 | Example 3 | Comparative Example 1 | Comparative Example 2 | Comparative Example 3 |
|---|---|---|---|---|---|---|---|
| Polymer (A) (parts by mass) | A1 | 100 | 100 | 100 | 100 | 100 | 100 |
| Crosslinking agent (B) (parts by mass) | B1 | 15 | 15 | 15 | 15 | 15 | 15 |
| Photocation generator (C) (parts by mass) | C1 | 3 | 3 | 3 | 3 | 3 | 3 |
| Compound (D) (parts by mass) | D1 | 1 | | | | | |
| | D2 | | 1 | 5 | | | |
| | d1 | | | | | | 3 |
| Organic solvent (E) (solvent composition, unit: % by mass) | E1 | 85 | 85 | 85 | 85 | 85 | 85 |
| | E2 | 15 | 15 | 15 | 15 | 15 | 15 |
| Other components (parts by mass) | F1 | 10 | 10 | 10 | 10 | 10 | 10 |
| | F2 | 0.05 | 0.05 | 0.05 | 0.05 | 0.05 | 0.05 |
| | F3 | | | | | 1 | |
| Solid component concentration (% by mass) | | 30 | 30 | 30 | 25 | 25 | 30 |

<3> Evaluations

The following evaluations were performed for the photosensitive resin compositions of Examples and Comparative Examples.

The results are shown in Table 2.

<3-1> Resolution Properties

A silicon wafer of 6 inch was spin-coated with each of the photosensitive resin compositions, which was then heated with a hotplate at 110° C. for 5 minutes to prepare a coating film. Next, the coating film was exposed to ultraviolet light from a high-pressure mercury lamp through a photomask using an aligner (manufactured by Suss Microtec SE, model "MA-150") such that the exposure amount at a wavelength testing machine (product name "SDWS-0201 type" manufactured by IMADA-SS Corporation). The measurement conditions were as follows: distance between chucks=2.5 cm, tensile speed=5 mm/min, and measurement temperature=23° C.

The result shows an average value of five measured values.

Next, the specimen after measurement of the "elongation (initial value)" was exposed to an environment with 10 cycles of thermal history, where one cycle of thermal history was the thermal history shown in FIG. 1 in which the oven set temperature changed from low temperature to high temperature in the atmosphere. The tensile elongation at break (%) of the specimen after exposure was taken as an "elongation (after acceleration test) and measured in the same manner as for the "elongation (initial value)".

("Elongation (initial value)"-"elongation (after acceleration test)")/(elongation (initial value)× 100 was calculated as a "rate of change in elongation".

<3-3> Dielectric Characteristics

Each of the photosensitive resin compositions was applied on a substrate having a mold release material and then heated with an oven at 110° C. for 5 minutes to prepare a coating film. Next, the entire surface of the coating film was irradiated with ultraviolet light from a high-pressure mercury lamp using an aligner (manufactured by Suss Microtec SE, model "MA-150") such that the exposure amount at a wavelength of 365 nm was 500 mJ/cm². Next, the coating film after exposure was heated with a hotplate at 150° C. for 3 minutes in a nitrogen atmosphere and further heated with an oven at 200° C. for 1 hour in a nitrogen atmosphere.

The coating film after heating was released from the substrate having a mold release material to obtain a resin film having a thickness of 10 μm. The relative dielectric constant ($\varepsilon_r$) and the dielectric loss tangent (tan δ) at 10 GHz of the obtained resin film were measured under the conditions of 23° C. and relative humidity 50% RH by a cavity resonator perturbation method using a dielectric characteristics measuring apparatus (a cavity resonator for 10 GHz, manufactured by KANTO Electronic Application and Development Inc.).

having 1 to 20 carbon atoms; and X's are each independently an oxygen atom, a sulfur atom, an amide bond, or $-SO_2-$,

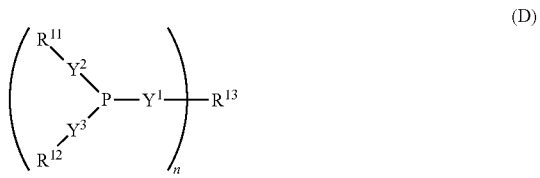

(D)

wherein in Formula (D), $Y^1$ to $Y^3$ are each independently a single bond or an oxygen atom; $R^{11}$ and $R^{12}$ are each independently a hydrogen atom, an alkyl group, or a monovalent group represented by Formula (d1); and n is an integer of 1 to 10, when n is 1, $R^{13}$ is a hydrogen atom, an alkyl group, or a monovalent group represented by Formula (d1), and at least one of $R^{11}$ to $R^{13}$ is a monovalent group represented by Formula (d1), when n is an integer of 2 to 10, $R^{13}$ is an n-valent organic group having at least one benzene ring optionally having an unsubstituted or substituted alkyl group having 1 to 20 carbon atoms, $Y^1$ in Formula (D) is bonded to the benzene ring in $R^{13}$, and, in the benzene ring in $R^{13}$ bonded to $Y^1$, at least one of ring carbon atoms at 2- and 6-positions relative to the ring carbon atom bonded to $Y^1$ is bonded to a hydrogen atom,

TABLE 2

| Photosensitive resin composition | Example 1 | Example 2 | Example 3 | Comparative Example 1 | Comparative Example 2 | Comparative Example 3 |
|---|---|---|---|---|---|---|
| Resolution properties | AA | AA | AA | AA | AA | AA |
| Elongation (initial value) | 55% | 55% | 55% | 57% | 55% | 65% |
| Elongation (after acceleration test) | 55% | 51% | 45% | 9% | 18% | 18% |
| Rate of change in elongation | 0% | 7% | 18% | 84% | 67% | 72% |
| Relative dielectric constant at 10 GHz | 2.5 | 2.5 | 2.6 | 2.5 | 2.5 | 2.5 |
| Dielectric loss tangent at 10 GHz | 0.004 | 0.004 | 0.005 | 0.005 | 0.005 | 0.005 |

The invention claimed is:

1. A photosensitive resin composition comprising:
   a polymer (A) comprising a structural unit (a1) represented by Formula (a1);
   a crosslinking agent (B);
   a photocation generator (C); and
   a compound (D) represented by Formula (D),

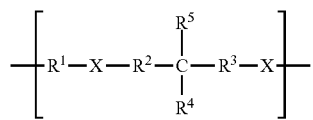

(a1)

wherein in Formula (a1), $R^1$ is an unsubstituted or substituted pyrimidine ring; $R^2$ and $R^3$ are each independently an unsubstituted or substituted aromatic hydrocarbon ring; $R^4$ is an unsubstituted or substituted alkyl group having 1 to 20 carbon atoms; $R^5$ is a hydrogen atom, or an unsubstituted or substituted alkyl group

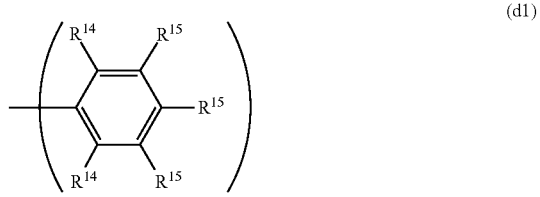

(d1)

wherein in Formula (d1), $R^{14}$'s are each independently a hydrogen atom, or an unsubstituted or substituted alkyl group having 1 to 20 carbon atoms, and at least one of $R^{14}$'s is a hydrogen atom; $R^{15}$'s are each independently a hydrogen atom, or an unsubstituted or substituted alkyl group having 1 to 20 carbon atoms.

2. The photosensitive resin composition according to claim 1, wherein the compound (D) is contained in the photosensitive resin composition in an amount of 0.01 to 20 parts by mass relative to 100 parts by mass of the polymer (A).

3. A method for producing a resin film having a pattern, the method comprising:
  forming a coating film on a substrate by applying the photosensitive resin composition according to claim 1;
  selectively exposing the coating film; and
  developing the coating film after the exposing of the coating film with a developing solution comprising an organic solvent.

4. A resin film having a pattern, the resin film being formed by the method according to claim 3.

5. A semiconductor circuit substrate comprising the resin film having a pattern according to claim 4.

6. The method according to claim 3, wherein the compound (D) is contained in the photosensitive resin composition in an amount of 0.01 to 20 parts by mass relative to 100 parts by mass of the polymer (A).

7. The method according to claim 3, wherein in the formula (a1), X represents an oxygen atom.

8. The photosensitive resin composition according to claim 1, wherein in the formula (a1), X represents an oxygen atom.

\* \* \* \* \*